US007259537B2

(12) United States Patent
Hauenstein et al.

(10) Patent No.: US 7,259,537 B2
(45) Date of Patent: Aug. 21, 2007

(54) POLARITY-REVERSAL PROTECTION CIRCUIT FOR ENERGY SOURCES

(75) Inventors: Henning Hauenstein, Reutlingen (DE); Richard Spitz, Reutlingen (DE); Stephan Ernst, Ostfildern (DE); Achim Henkel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 239 days.

(21) Appl. No.: 10/479,074

(22) PCT Filed: May 11, 2002

(86) PCT No.: PCT/DE02/01707

§ 371 (c)(1),
(2), (4) Date: May 18, 2004

(87) PCT Pub. No.: WO02/097943

PCT Pub. Date: Dec. 5, 2002

(65) Prior Publication Data

US 2004/0189261 A1  Sep. 30, 2004

(30) Foreign Application Priority Data

May 26, 2001 (DE) ................ 101 25 828

(51) Int. Cl.
*H02J 7/14* (2006.01)
(52) U.S. Cl. .............. 320/103; 320/104; 361/84; 361/82
(58) Field of Classification Search ........ 320/103, 320/104, 105; 361/82, 84
See application file for complete search history.

(56) References Cited

U.S. PATENT DOCUMENTS

| 4,367,887 A | * | 1/1983 | Takada | 280/803 |
| 4,398,252 A | * | 8/1983 | Frait | 701/70 |
| 5,806,621 A | * | 9/1998 | Soda et al. | 180/206 |
| 6,239,515 B1 | * | 5/2001 | Mackel et al. | 307/127 |
| 6,323,608 B1 | * | 11/2001 | Ozawa | 318/139 |

FOREIGN PATENT DOCUMENTS

| DE | 2236846 | | 7/1972 |
| DE | 195 01 985 | | 7/1996 |
| DE | 199 51 094 | | 5/2001 |
| DE | 10344896 | * | 4/2005 |
| FR | 2 456 412 | | 12/1980 |
| JP | 64010053 | * | 1/1989 |
| JP | 01091625 | * | 4/1989 |
| JP | 03027648 | * | 3/1990 |
| JP | 10315849 | * | 12/1998 |

* cited by examiner

*Primary Examiner*—Karl Easthom
*Assistant Examiner*—Samuel Berhanu
(74) *Attorney, Agent, or Firm*—Kenyon & Kenyon LLP

(57) ABSTRACT

A polarity-reversal protector for power sources, in particular for automobile batteries, which is connected between a power source and at least one consumer and/or at least one generator, is described. The polarity-reversal protector is to prevent the reverse polarity current from flowing through the connected systems, so that the systems may not be damaged in case of polarity reversal. For this purpose, the polarity-reversal protector includes means for recognizing whether the two poles of the power source are connected to the appropriate terminals of the consumer and/or generator, and means for decoupling the power source from the consumer and/or from the generator if the two poles of the power source have been transposed during connection to the consumer and/or generator.

21 Claims, 3 Drawing Sheets

POLARITY-REVERSAL PROTECTION CIRCUIT FOR ENERGY SOURCES

FIELD OF THE INVENTION

The present invention relates to a polarity-reversal protector for power sources, in particular for automobile batteries, which is connected between a power source and at least one consumer and/or at least one generator.

BACKGROUND INFORMATION

A polarity-reversal protector of this type can, in principle, be used in connection with power sources for greatly varying applications. The mode of operation and advantages of such a polarity-reversal protector are explained in the following on the basis of the example of a power source used in motor vehicle technology, specifically an automobile battery and/or a power source which temporarily replaces the automobile battery. The automobile battery is typically only installed and connected to the vehicle electrical system directly before the motor vehicle is put into operation, so that it can supply multiple consumers with power and is also recharged again and again via a generator, the dynamo. During the vehicle manufacturing, the vehicle testing, and even during transport, an external power source, which then temporarily fulfills the function of the automobile battery, is connected to the vehicle electrical system only if necessary. However, even after a motor vehicle is put into operation, it can be necessary to bypass the automobile battery temporarily using an external power source, when a starting aid is used, for example.

In all of these cases, the poles of the particular power source to be connected are transposed again and again in practice, which is referred to as polarity reversal. Overheating of parts of the generator and even destruction of the generator, for example, can occur in this case. In addition, surrounding systems of the vehicle electrical system can be destroyed by the local generation of heat. Overall, polarity reversal represents a danger for the safety of all connected systems and also of the power source itself.

SUMMARY OF THE INVENTION

The present invention proposes a polarity-reversal protector for power sources which prevents the reverse polarity current from flowing through the connected systems, ensuring that these systems are not damaged in the case of polarity reversal.

For this purpose, according to the present invention, the aforementioned polarity-reversal protector includes means for recognizing whether the two poles of the power source are connected to the appropriate terminals of the consumer and/or generator, and means for decoupling the power source from the consumer and/or from the generator if the two poles of the power source have been transposed during connection to the consumer and/or generator.

In connection with an automobile battery and/or a power source which temporarily replaces the automobile battery, the polarity-reversal protector according to the present invention prevents overheating of the generator caused by polarity reversal. The risk of severe resulting damage to the rectifier of the dynamo is thus minimized. In addition, the polarity-reversal protector according to the present invention also prevents damage to the other systems dependent on the vehicle electrical system as well as the automobile battery and/or the power source itself. In this way, resulting costs caused by complex fault locating for a polarity reversal, for example, may be saved.

In principle, there are various possibilities for implementing the polarity-reversal protector according to the present invention and, in particular, for the means for disconnecting the power source from the consumer and/or from the generator if the two poles of the power source have been transposed during connection to the consumer and/or generator. This case is referred to in the following as the first polarity reversal case.

In an advantageous variation of the polarity-reversal protector according to the present invention, a polarity reversal circuit is provided for this purpose, which connects the two poles of the power source to one another via at least one switch and at least one fuse. The fuse is also positioned in the connection between one of the poles of the power source and the corresponding terminal of the consumer and/or the generator. The switch is activated by the means for recognizing the first polarity reversal case and is closed in the first polarity reversal case, so that the two poles of the power source are short-circuited. In this case, the polarity reversal circuit is opened via the fuse, through which the power source is decoupled in a controlled way from the consumers connected to the polarity-reversal protector and possibly from a connected generator.

For this variant of a polarity-reversal protector according to the present invention, mounting of the polarity-reversal protector on the power source with the poles reversed is not critical, since when installed the polarity-reversal protector represents an open circuit between the two poles of the power source, the internal terminals. The terminals of the power source accessible from the outside, the external terminals, are separated from the internal terminals by circuit engineering. A direct connection path is provided between each of the external terminals and the corresponding internal terminal. In addition, the two internal terminals of the power source are connected to one another via a short circuit, the polarity reversal circuit. The fuse, which is positioned in a part of the polarity reversal circuit which is simultaneously a part of a direct connection path between one of the internal terminals and the corresponding external terminal, is used as an integral protector of the power source in the event of short circuit of the two internal terminals. In addition, the fuse is used for decoupling the power source, through which, in the case of an automobile battery, outgassing or exploding of the battery is prevented. The fuse has the advantage over a power switch, for example, that it does not require its own power supply. In the normal case, the polarity reversal circuit having the fuse thus does not cause any power loss. The fuse, and therefore the entire polarity-reversal protector, is completely functional even with an automobile battery which is only weakly charged.

As already mentioned, in practice the necessity often arises of bypassing a first power source using a further power source. Thus, for example, an automobile battery is bypassed using an external battery in starting aid situations. In these cases as well, there is a danger of polarity reversal, specifically the danger that the terminals of the further power source were not connected to the corresponding poles of the first power source, but rather were transposed during connection. This case is referred to in the following as the second polarity reversal case.

In order to also avoid the second polarity reversal case, a polarity-reversal protector is proposed according to the present invention which is connected between the first power source and the consumer(s) and/or a generator and is equipped with at least one first supply terminal for connecting the further power source. The polarity-reversal protector also includes means for recognizing the second polarity reversal case, i.e., whether the pole of the further power source provided for this purpose is connected to the first supply terminal. Finally, means are also provided for decoupling the further power source if the second polarity reversal case exists. In an advantageous variation of this polarity-reversal protector, the first supply terminal and the corresponding pole of the first power source are simply connected via a switch. This switch is activated by the means for recognizing the second polarity reversal case, so that it is opened in the second polarity reversal case. In this way, an incorrectly connected further power source is simply automatically decoupled.

It is to be noted here that the polarity-reversal protector according to the present invention described above may be implemented for the second polarity reversal case both independently of the polarity-reversal protector proposed according to the present invention for the first polarity case and in the form of an expansion of this polarity-reversal protector for the first polarity reversal case. This also applies for the variation of a polarity-reversal protector according to the present invention described in the following, which is also conceived for the second polarity reversal case.

Finally, a polarity-reversal protector for power sources is also proposed according to the present invention, which automatically correctly connects the terminals of a further power source, which is to bypass the first power source, to the poles of the first power source, and does so independently of how the further power source has been connected to the polarity-reversal protector. This polarity-reversal protector is also connected between the first power source and the consumer(s) and/or the generator and includes a first and a second supply terminal for connecting the further power source. In addition, means are provided for recognizing the connection situation, i.e., means for recognizing which pole of the further power source is connected to which of the two supply terminals. Finally, this polarity-reversal protector also includes means for automatically connecting the supply terminals to the terminals of the first power source, so that the poles of the further power source are connected to the appropriate terminals of the first power source in any case. In an advantageous variation of this polarity-reversal protector, the latter means for automatically connecting the supply terminals are implemented in the form of switches, which are activated by the means for recognizing the connection situation and via which the two supply terminals are each alternatively connectable to one of the two poles of the first power source.

The aforementioned means for recognizing the first polarity reversal case and the means for recognizing the second polarity reversal case and the means for recognizing the connection situation advantageously include at least one polarity reversal detector and an analysis unit for the measurement data of the polarity reversal detector. A polarity reversal may, for example, be detected via direct or indirect current measurement on a line of the polarity-reversal protector which carries a strong current. For this purpose, a current sensor and/or a magnetic sensor may be used, for example. A polarity reversal may also, however, be detected using a voltage sensor, which taps the voltage at a suitable point, between the power source and the consumer, for example.

For variations of the polarity-reversal protector according to the present invention which are designed for both the first and the second polarity reversal case, it has been shown to be advantageous if the measurement data detected by the different polarity reversal detectors is analyzed in a joint analysis unit.

The analysis unit is advantageously implemented in the form of an integrated circuit. In this way, the reaction time of the polarity-reversal protector may be shortened sufficiently that the power source is decoupled in case of polarity reversal before the connected systems are damaged. For power supply, the analysis unit may advantageously be connected to the internal terminals of the power source. In the case of a polarity-reversal protector for an automobile battery, the analysis unit may also be physically separated from the automobile battery and, for example, be integrated into another battery checking unit and/or the engine control unit.

In the event of extremely low external temperatures, for example, the activation of the polarity reversal circuit may be suppressed in the case of an automobile battery, since under these conditions extremely high currents are necessary for starting the vehicle, which are then not to be attributed to a polarity reversal. This suppression may either be performed in the analysis unit itself or may be predetermined by an external control unit via at least one signal input.

It has also been shown to be advantageous if a signaling device is provided for displaying a polarity reversal case, since the vehicle user may thus immediately recognize the cause of the malfunction.

DETAILED DESCRIPTION

Figure 1:
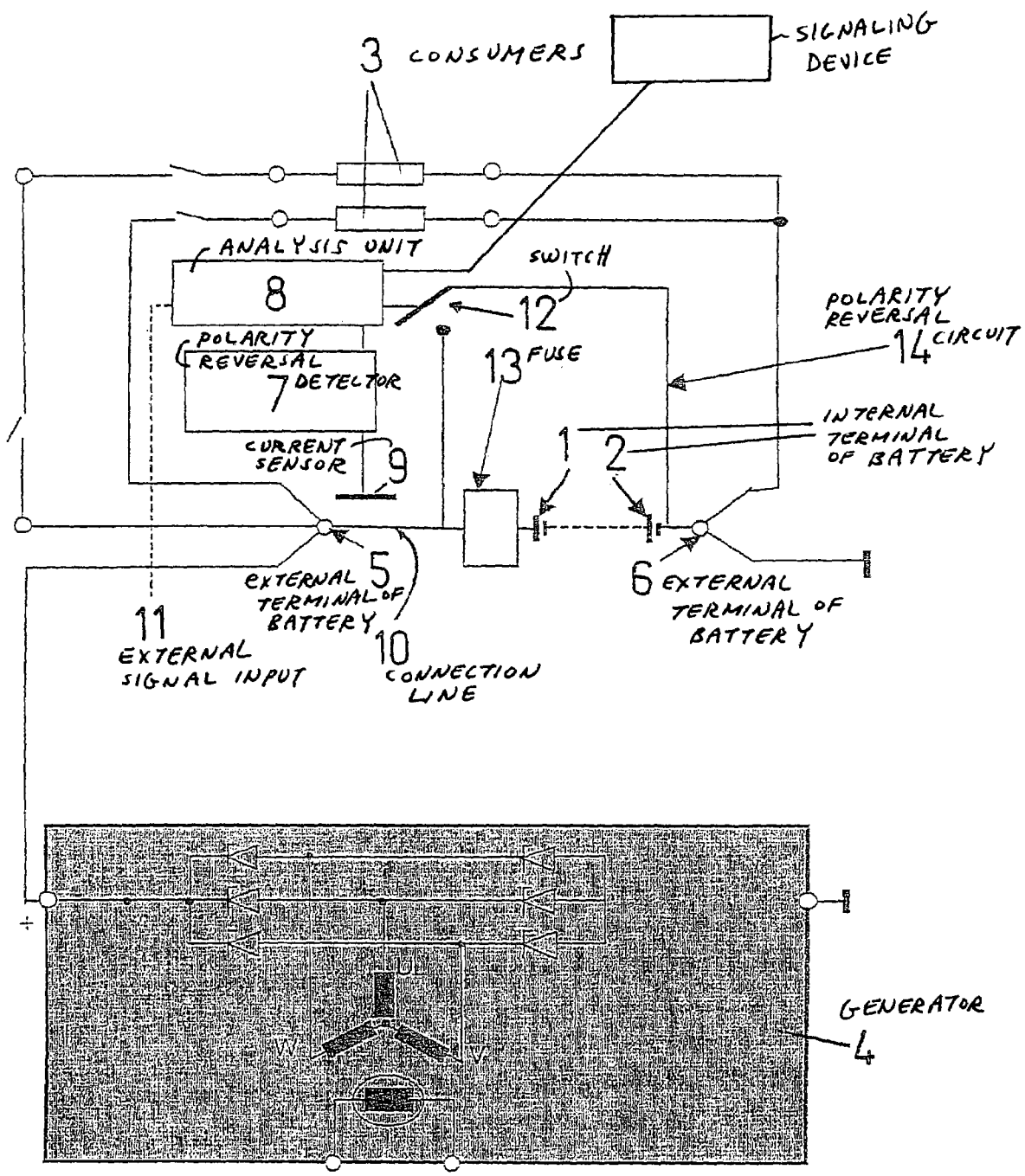
FIG. 1 shows the circuit diagram of a polarity-reversal protector according to the present invention for an automobile battery, which is conceived for the first polarity reversal case.
Figure 2:
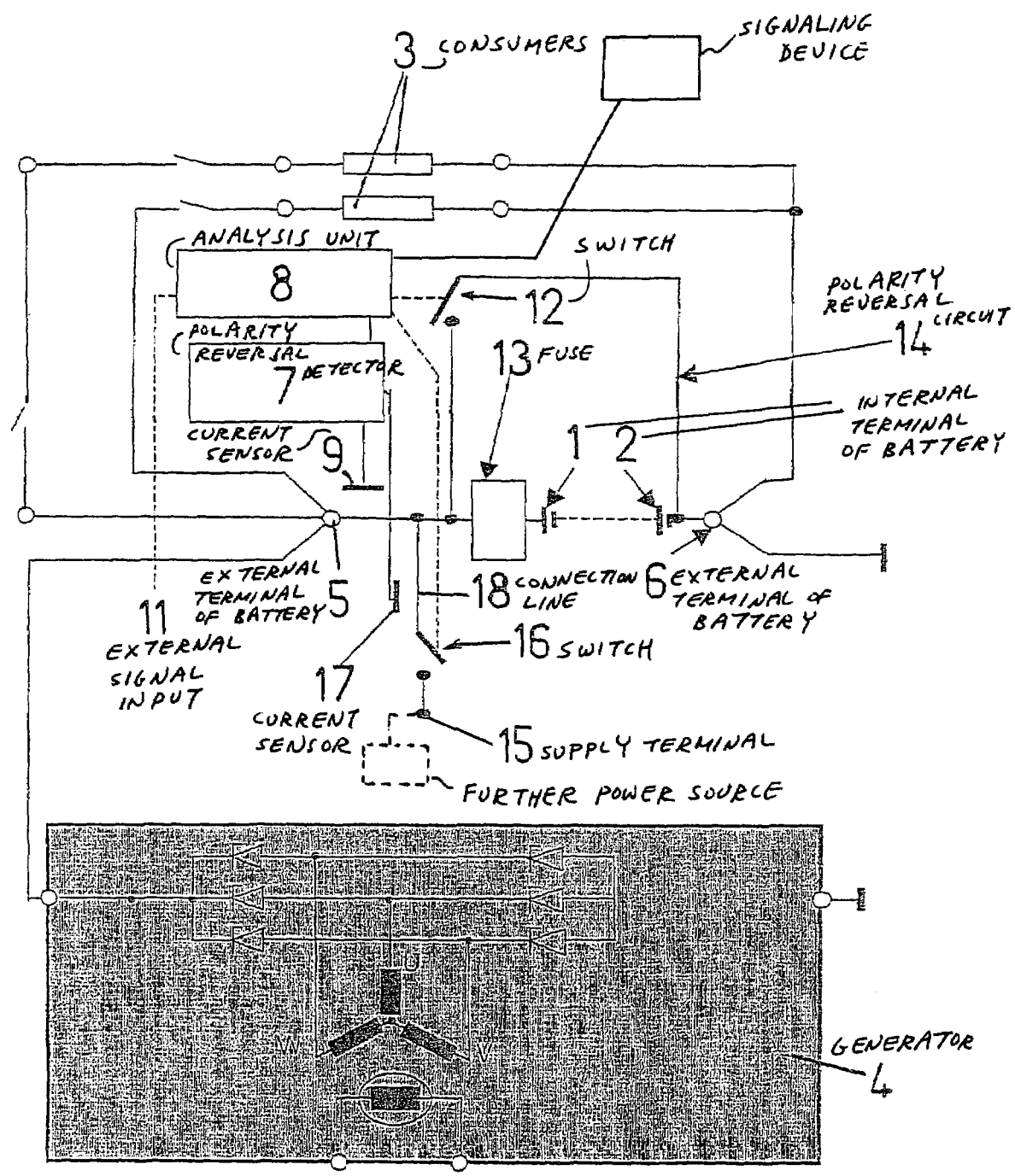
FIG. 2 shows the circuit diagram of a further polarity-reversal protector according to the present invention for an automobile battery, which is conceived for both the first and the second polarity reversal cases.
Figure 3:
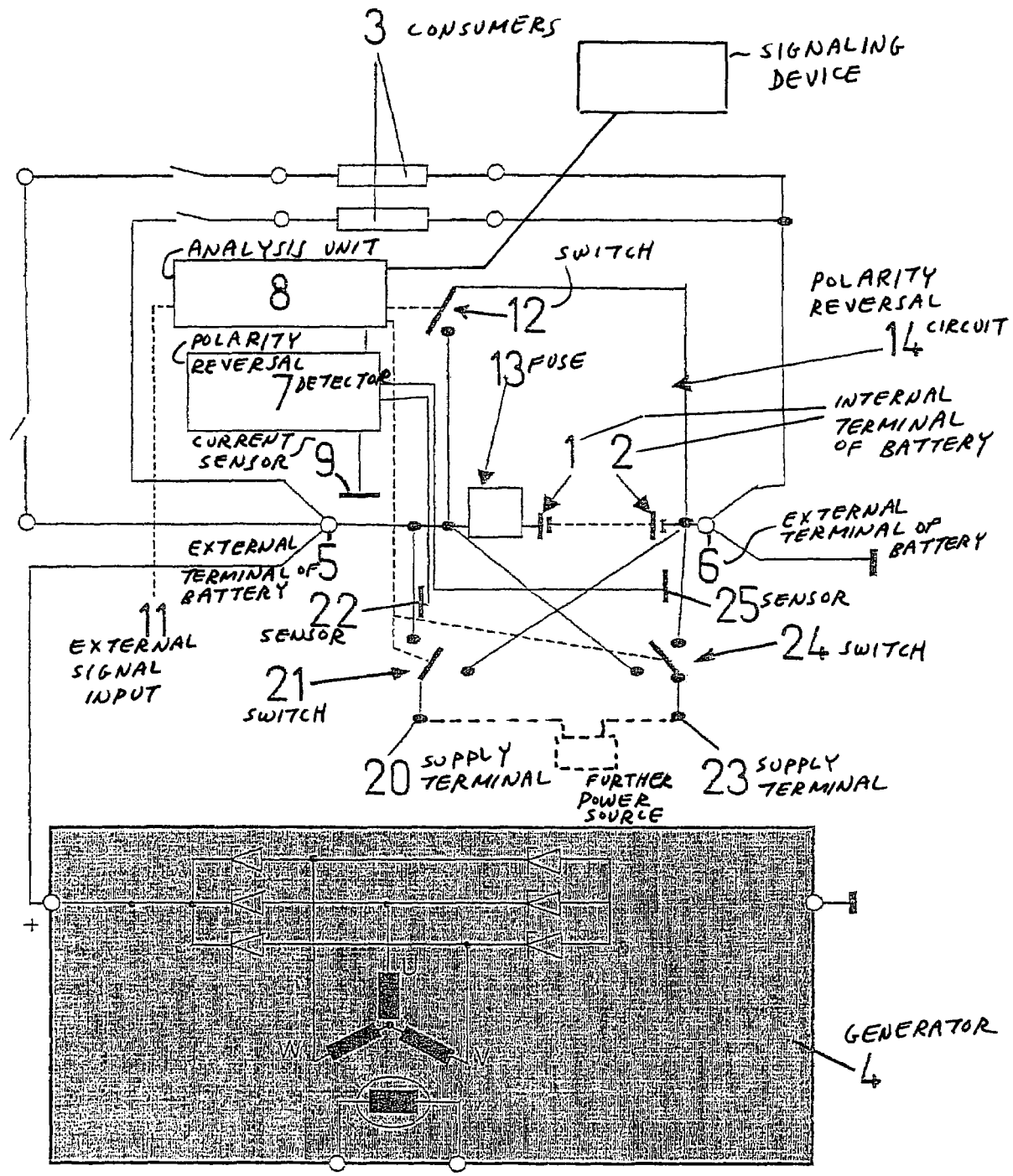
FIG. 3 shows the circuit diagram of a third polarity-reversal protector according to the present invention for an automobile battery, which is conceived for both the first and the second polarity reversal cases.

The polarity-reversal protector circuit shown in FIG. 1 is a component of each of the polarity-reversal protector circuits shown in FIGS. 2 and 3. The circuit parts and/or circuit elements which are identical in all three figures are therefore also provided with identical reference numbers in all three figures.

All three figures each show a polarity-reversal protector for an automobile battery, of which only the two poles 1 and 2 are shown. These poles 1 and 2 are also referred to in the following as the internal terminals of the automobile battery. In all three figures, the polarity-reversal protector and/or the polarity-reversal protector circuit is connected between the automobile battery and two connected consumers 3 as well as a connected generator 4, via which the automobile battery is recharged again and again.

The polarity-reversal protector circuit shown in FIG. 1 implements a disconnection between internal terminals 1 and 2 of the automobile battery and the externally accessible terminals of the automobile battery, to which consumers 3 and generator 4 are connected. These terminals are also referred to in the following as external terminals 5 and 6 of the automobile battery.

According to the present invention, the polarity-reversal protector circuit shown in FIG. 1 includes means for recognizing whether both poles 1 and 2 of the automobile battery are connected to the appropriate terminals of consumers 3 and/or generator 4. In addition, according to the present invention, the polarity-reversal protector circuit includes means for decoupling the automobile battery from consumers 3 and generator 4 if poles 1 and 2 of the automobile battery have been transposed during connection, i.e., in the first polarity reversal case.

In the exemplary embodiment shown here, the means for recognizing the first polarity reversal case include a polarity reversal detector 7 and an analysis unit 8 for the measurement data of polarity reversal detector 7. This detector includes a current sensor 9 or a magnetic sensor, which indirectly detects the current strength in connection line 10 between internal terminal 1 and external terminal 5, which has a strong current flowing through it. The first polarity reversal case may also, however, be detected via a direct current measurement. Analysis unit 8 analyzes the current strength and/or the change of the current strength and thus recognizes whether the first polarity reversal case exists. The analysis of the measurement data of polarity reversal detector 7 may be influenced via an external signal input 11 in a targeted way, via the engine control unit, for example.

In the exemplary embodiment shown here, a polarity reversal circuit 14, which connects both poles 1 and 2 of the automobile battery to one another via a switch 12 and a fuse 13, is provided for decoupling the automobile battery. Fuse 13, which may simply be a blow-out fuse, is positioned in the connection between internal terminal 1 and external terminal 5. Switch 12 is activated via analysis unit 8 and is closed in the first polarity reversal case. At the same time, the two poles of the automobile battery are short-circuited. In this way, not only is polarity reversal circuit 14 disconnected in a controlled way via fuse 13, but rather the connection between internal terminal 1 and external terminal 5 is also disconnected, through which the automobile battery is decoupled from consumers 3 and generator 4. Fuse 13 is thus used not only as an integral protector for the automobile battery, but also as a protector for the systems connected to the automobile battery.

In the event of an external start, i.e., in the event of starting of a motor vehicle using an external power source, there is also the danger of polarity reversal, specifically the danger that the poles of the external power source were not connected to the appropriate poles of the automobile battery already installed. FIG. 2 shows an expansion of the polarity-reversal protector circuit shown in FIG. 1, which avoids this danger. For this purpose, a separate supply terminal 15 is provided for the external start. This supply terminal 15 is connected via a switch 16 to external terminal 5, on which the vehicle electrical system, i.e., consumers 3 and generator 4, are also dependent. In the exemplary embodiment shown here, a separate current sensor 17 is provided for supply terminal 15, which detects the current strength in connection line 18 between supply terminal 15 and external terminal 5. By analyzing this measurement data with the aid of analysis unit 8, it may be recognized whether the pole of the external power source provided for this purpose is connected to supply terminal 15, i.e., in this case the pole of the external power source corresponding to internal terminal 1. Switch 16 is also activated via analysis unit 8, so that it is opened if the two poles of the external power source were transposed during connection to supply terminal 15, which is referred to as the second polarity reversal case. Switch 16 therefore only permits one current flow, when there is no polarity reversal.

FIG. 3 shows a polarity-reversal protector circuit which is also conceived for the connection of an external power source and automatically correctly connects the poles of the external power source to the poles of the automobile battery. For this purpose, two supply terminals, specifically a first supply terminal 20 and a second supply terminal 23, are provided for connection of the external power source, using which the automobile battery is to be bypassed. First supply terminal 20 may be connected alternatively to external terminal 5 or external terminal 6 via a first switch 21, while second supply terminal 23 may be connected alternatively to external terminal 6 or external terminal 5 of the automobile battery via a second switch 24. For recognizing the connection situation, i.e., for recognizing which pole of the external power source is connected to which of both supply terminals 20 or 23, polarity reversal detector 7 includes two sensors 22 and 25 in the exemplary embodiment shown here, which are positioned corresponding to current sensor 17 shown in FIG. 2. In this case as well, the measurement data of sensors 22 and 25 is analyzed by analysis unit 8, which then activates both switches 21 and 24 in such a way that the poles of the external power source are connected to the appropriate terminals of the automobile battery in any case.

What is claimed is:

1. A polarity-reversal protector for a first power source and connected between the first power source and at least one of at least one consumer and at least one generator, comprising:
   a recognition arrangement recognizing whether two poles of the first power source are connected to terminals of the at least one of the at least one consumer and the at least one generator;
   a decoupling arrangement decoupling the first power source from the at least one of the at least one consumer and the at least one generator if the two poles have been transposed during connection to the at least one of the at least one consumer and the at least one generator according to a first polarity reversal case;
   the recognition arrangement recognizing the first polarity reversal case;
   at least one first switch;
   at least one first fuse; and
   a polarity reversal circuit connecting the two poles to one another via the at least one first switch and the at least one fuse, wherein:
      the at least one fuse is positioned in a connection between one of the two poles and a corresponding terminal of the at least one of the at least one consumer and the at least one generator, and
      the at least one first switch is activated by the recognition arrangement recognizing the first polarity reversal case, so that the at least one first switch is closed in the first polarity reversal case and the two poles are short-circuited, the polarity reversal circuit being opened via the at least one first fuse, and the first power source being decoupled from the at least one of the at least one consumer and the at least one generator.

2. The polarity-reversal protector as recited in claim 1, wherein:
   the first power source includes an automobile battery.

3. A polarity-reversal protector for a first power source and connected between the first power source and at least one of at least one consumer and at least one generator, comprising:
   a recognition arrangement recognizing whether two poles of the first power source are connected to terminals of the at least one of the at least one consumer and the at least one generator;

a decoupling arrangement decoupling the first power source from the at least one of the at least one consumer and the at least one generator if the two poles have been transposed during connection to the at least one of the at least one consumer and the at least one generator according to a first polarity reversal case;

at least one first supply terminal for connecting a further power source to bypass the first power source;

the recognition arrangement recognizing whether a pole of the further power source is connected to the at least one first supply terminal; and a decoupling arrangement decoupling the further power source if two poles of the further power source have been transposed during connection to the at least one first supply terminal according to a second polarity reversal case.

4. The polarity-reversal protector as recited in claim 3, wherein:

the recognition arrangement recognizes the second polarity reversal case; and at least one first switch via which the at least one first supply terminal and a corresponding one of the two poles of the first power source are connected, wherein: the at least one first switch is activated by the recognition arrangement when the second polarity reversal case is recognized, so that the at least one first switch is opened in the second polarity reversal case.

5. A polarity-reversal protector for a first power source and connected between the first power source and at least one of at least one consumer and at least one generator, comprising:

a recognition arrangement recognizing whether two poles of the first power source are connected to terminals of the at least one of the at least one consumer and the at least one generator;

a decoupling arrangement decoupling the first power source from the at least one of the at least one consumer and the at least one generator if the two poles have been transposed during connection to the at least one of the at least one consumer and the at least one generator according to a first polarity reversal case;

a first supply terminal and a second supply terminal for connecting a further power source to bypass the first power source;

the recognition arrangement recognizing which pole of the further power source is connected to which of the first supply terminal and the second supply terminal; and a connection arrangement automatically connecting the first supply terminal and the second supply terminal to terminals of the first power source, so that poles of the further power source are connected to the two poles of the first power source.

6. The polarity-reversal protector as recited in claim 5, further comprising:

at least one switch via which the first supply terminal and the second supply terminal are each alternatively connectable to one of the two poles of the first power source, wherein:

the at least one switch is activated by the recognition arrangement recognizing which pole of the fixture power source is connected to which of the first supply terminal and the second supply terminal.

7. The polarity-reversal protector as recited in claim 1, wherein:

the recognition arrangement recognizing the first polarity reversal case includes at least one polarity reversal detector and an analysis unit for measuring data of the at least one polarity reversal detector.

8. The polarity-reversal protector as recited in claim 4, wherein:

the recognition arrangement recognizing the second polarity reversal case includes at least one polarity reversal detector and an analysis unit for measuring data of the at least one polarity reversal detector.

9. The polarity-reversal protector as recited in claim 5, wherein:

the recognition arrangement recognizing which pole of the further power source is connected to which of the first supply terminal and the second supply terminal includes at least one polarity reversal detector and an analysis unit for measuring data of the at least one polarity reversal detector.

10. The polarity-reversal protector as recited in claim 7, wherein:

the at least one polarity reversal detector includes one of a current sensor and a magnetic sensor.

11. The polarity-reversal protector as recited in claim 8, wherein:

the at least one polarity reversal detector includes one of a current sensor and a magnetic sensor.

12. The polarity-reversal protector as recited in claim 9, wherein:

the at least one polarity reversal detector includes one of a current sensor and a magnetic sensor.

13. The polarity-reversal protector as recited in claim 7, wherein:

the at least one polarity reversal detector includes at least one voltage sensor.

14. The polarity-reversal protector as recited in claim 8, wherein:

the at least one polarity reversal detector includes at least one voltage sensor.

15. The polarity-reversal protector as recited in claim 9, wherein:

the at least one polarity reversal detector includes at least one voltage sensor.

16. The polarity reversal detector as recited in claim 7, wherein:

the analysis unit includes at least one external signal input via which an analysis of measurement data of the at least one polarity reversal detector can be influenced in a targeted way.

17. The polarity reversal detector as recited in claim 8, wherein:

the analysis unit includes at least one external signal input via which an analysis of measurement data of the at least one polarity reversal detector can be influenced in a targeted way.

18. The polarity reversal detector as recited in claim 9, wherein:

the analysis unit includes at least one external signal input via which an analysis of measurement data of the at least one polarity reversal detector can be influenced in a targeted way.

19. The polarity-reversal protector as recited in claim 1, further comprising:

at least one signaling device for displaying the first polarity reversal case.

20. The polarity-reversal protector as recited in claim 3, further comprising:

at least one signaling device for displaying one of the first polarity reversal case and the second polarity reversal case.

21. The polarity-reversal protector as recited in claim 5, further comprising:

at least one signaling device for displaying the first polarity reversal case.

* * * * *